United States Patent
Zhou (10) Patent No.: US 10,199,494 B2
(45) Date of Patent: Feb. 5, 2019

(54) LATERALLY DIFFUSED METAL-OXIDE-SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/669,322

(22) Filed: Aug. 4, 2017

(65) Prior Publication Data

US 2018/0061981 A1    Mar. 1, 2018

(30) Foreign Application Priority Data

Aug. 31, 2016   (CN) .......................... 2016 1 0788877

(51) Int. Cl.
*H01L 29/00*   (2006.01)
*H01L 29/78*   (2006.01)
(Continued)

(52) U.S. Cl.
CPC .. *H01L 29/7816* (2013.01); *H01L 21/823821* (2013.01); *H01L 21/845* (2013.01);
(Continued)

(58) Field of Classification Search
CPC ............ H01L 29/7816; H01L 29/7835; H01L 29/785; H01L 27/0886; H01L 29/66659;
(Continued)

(56) References Cited

U.S. PATENT DOCUMENTS 9,698,148 B2 * 7/2017 Ponoth ................ H01L 27/0924
9,761,657 B2 * 9/2017 Hsiao .................. H01L 29/0638
(Continued)

FOREIGN PATENT DOCUMENTS

CN   105826189 A    8/2016

OTHER PUBLICATIONS

The European Patent Office (EPO) The Extended European Search Report for 17186345.9 dated Jan. 26, 2018 9 Pages.

*Primary Examiner* — Ngan Ngo
(74) *Attorney, Agent, or Firm* — Anova Law Group, PLLC (57) ABSTRACT

The present disclosure provides a laterally diffused metal-oxide-semiconductor (LDMOS) device. The LDMOS device includes a plurality of fin structures formed on a substrate including a first device region, a second device region, and an isolation region sandwiched between the two regions. An opening is formed in the fin structures in the isolation region. The LDMOS device further includes an isolation layer formed in the opening and covering the sidewall of the opening formed by a portion of each fin structure in the first device region. The isolation layer exposes top surfaces of the plurality of fin structures. Moreover, the LDMOS device also includes a gate structure formed across each fin structure in the first device region. The gate structure covers a portion of the sidewall and the top surfaces of the fin structure formed in the first device region and also covers the top surface of the isolation layer.

19 Claims, 7 Drawing Sheets

(51) Int. Cl.
  *H01L 21/8238* (2006.01)
  *H01L 27/092* (2006.01)
  *H01L 29/10* (2006.01)
  *H01L 21/84* (2006.01)
  *H01L 29/66* (2006.01)
  *H01L 27/088* (2006.01)
  *H01L 29/06* (2006.01)

(52) U.S. Cl.
  CPC ...... *H01L 27/0886* (2013.01); *H01L 27/0924* (2013.01); *H01L 29/0653* (2013.01); *H01L 29/1095* (2013.01); *H01L 29/66659* (2013.01); *H01L 29/66681* (2013.01); *H01L 29/66689* (2013.01); *H01L 29/66795* (2013.01); *H01L 29/785* (2013.01); *H01L 29/7835* (2013.01)

(58) Field of Classification Search
  CPC ......... H01L 29/66681; H01L 29/66795; H01L 29/1095; H01L 21/823821; H01L 21/845; H01L 27/0924
  See application file for complete search history.

(56) References Cited

U.S. PATENT DOCUMENTS

| | | | |
|---|---|---|---|
| 2007/0123051 A1 | 5/2007 | Arghavani et al. | |
| 2012/0049279 A1 | 3/2012 | Shrivastava et al. | |
| 2016/0149030 A1* | 5/2016 | Kim | H01L 29/7816 257/337 |
| 2016/0225895 A1 | 8/2016 | He et al. | |
| 2016/0225896 A1* | 8/2016 | Yoo | H01L 29/7848 |
| 2017/0194487 A1* | 7/2017 | Chen | H01L 29/7816 |
| 2017/0365602 A1* | 12/2017 | Zhou | H01L 27/0922 |
| 2017/0365603 A1* | 12/2017 | Zhou | H01L 27/0924 |

* cited by examiner

LATERALLY DIFFUSED METAL-OXIDE-SEMICONDUCTOR DEVICES AND FABRICATION METHODS THEREOF

CROSS-REFERENCES TO RELATED APPLICATIONS

This application claims the priority of Chinese Patent Application No. CN201610788877.0, filed on Aug. 31, 2016, the entire content of which is incorporated herein by reference.

FIELD OF THE DISCLOSURE

The present disclosure generally relates to the field of semiconductor fabrication technology and, more particularly, relates to laterally diffused metal-oxide-semiconductor devices and fabrication methods thereof.

BACKGROUND

With rapid development of semiconductor fabrication technology, semiconductor devices are advanced in a direction of having higher component density, higher integration level, and better performance.

Laterally diffused metal-oxide-semiconductor (LDMOS) device is a power device with a double-diffused structure. The LDMOS device is typically fabricated by performing two ion implantation processes onto a substrate. For example, one implantation process may introduce arsenic (As) ions with a relatively high concentration into the substrate, while the other implantation process may introduce boron (B) ions with a relatively low concentration. After performing the two ion implantation processes, a high temperature annealing process is performed. During the high temperature annealing process, boron ions often diffuse quicker than arsenic ions. Therefore, along a lateral direction under the gate electrode, boron ions may diffuse further than arsenic ions, and thus form a channel with a concentration gradient. The length of the channel is determined by the difference between the diffusion lengths of the two types of ions along the lateral direction. Moreover, in order to increase the breakdown voltage, a drift region may be formed between the source region and the drain region of the device.

The drift region in LDMOS devices is the key to the design of the devices. The impurity concentration in the drift region is relatively low. When an LDMOS device receives a high voltage, the device may be able to sustain such a high voltage because of the high resistance of the drift region. Moreover, LDMOS devices demonstrate advantages including high gain, high reliability, etc. and may also show desired process compatibility with existing CMOS devices, and thus LDMOS devices are widely used in various fields.

However, the gate dielectric layer in existing LDMOS devices may be easily broken down. The disclosed semiconductor structures and fabrication methods thereof are directed to solve one or more problems set forth above and other problems in the art.

BRIEF SUMMARY OF THE DISCLOSURE

One aspect of the present disclosure includes a laterally diffused metal-oxide-semiconductor (LDMOS) device. The LDMOS device includes a plurality of fin structures formed on a substrate. The substrate includes a first device region, a second device region, and an isolation region sandwiched between the first device region and the second device region. An opening is formed in the fin structures in the isolation region. The LDMOS device further includes an isolation layer formed in the opening and covering a sidewall of the opening formed by a portion of each fin structure in the first device region. The isolation layer exposes the top surfaces of the plurality of fin structures. Moreover, the LDMOS device includes a gate structure formed across each fin structure in the first device region. The gate structure covers a portion of the sidewall and the top surfaces of the fin structure formed in the first device region and also covers the top surface of the isolation layer.

Another aspect of the present disclosure provides a method for fabricating an LDMOS device. The method for fabricating the LDMOS device includes forming a plurality of fin structures on a substrate. The substrate includes a first device region, a second device region, and an isolation region sandwiched between the first device region and the second device region. An opening is formed in the fin structures in the isolation region. The method further includes forming an isolation layer in the opening to cover a sidewall of the opening formed by a portion of each fin structure in the first device region. Moreover, the method also includes forming a gate structure across each fin structure in the first device region. The gate structure covers a portion of the sidewall and the top surfaces of the fin structure formed in the first device region and also covers the top surface of the isolation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The gate dielectric layer in LDMOS devices may be easily broken down. In the following, the breakdown of the gate dielectric layer in an LDMOS device may be discussed.

Figure 1:
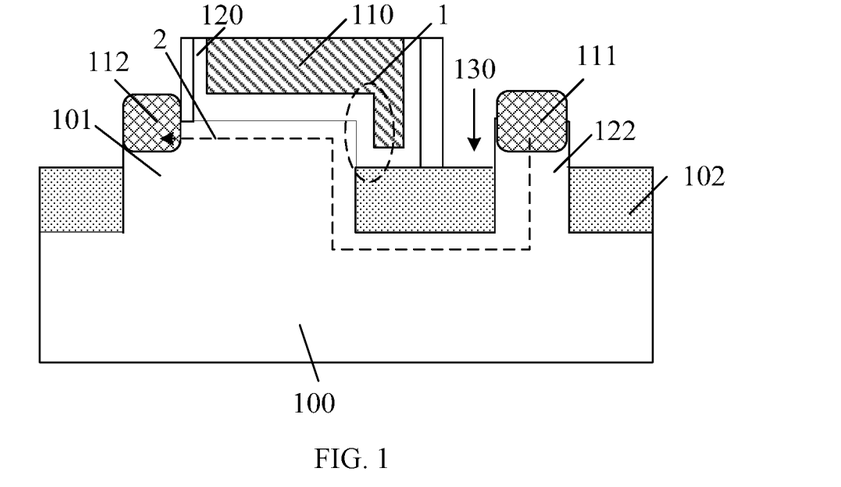
FIG. 1 illustrates a schematic cross-section view of an LDMOS device.

FIG. 1 shows a schematic cross-section view of an LDMOS device. Referring to FIG. 1, the LDMOS device includes a base structure including a substrate 100 and a fin structure 101 formed on the substrate 100. An opening 130 is formed in the fin structure 101. The LDMOS device also includes an isolation structure 102 formed on the substrate 100 with a top surface lower than the top surface of the fin structure 101, and a gate structure formed across the fin structure. The gate structure covers a portion of the sidewall surface of the opening 130. The gate structure further includes a gate dielectric layer 120 and a gate electrode 110 formed on the gate dielectric layer 120. The gate dielectric layer 120 covers a portion of the sidewall surface of the opening 130 and a portion of the sidewall and the top surfaces of the fin structure 120. Moreover, the LDMOS device also includes a source region 112 and a drain region 111 formed in the fin structure 101 on the two opposite sides of the gate electrode 110.

In the LDMOS device, an opening 130 is formed in the fin structure 101 and an isolation structure 102 is formed in the opening 130. The isolation structure 102 formed in the opening 130 may increase the length of the path 2 of the current in the channel of the device, and thus, the LDMOS device may sustain very high voltage. In addition, the gate structure covers a portion of the sidewall surface of the opening 130 to avoid exposure of the portion of sidewall surface of the opening 130. Therefore, the channel of the LDMOS device is not exposed, and thus leakage current due to exposure of the channel may be reduced.

However, because the surface of the isolation structure is lower than the top surface of the fin structure 101, the portion of the gate dielectric layer 120 that covers the sidewall surface of the opening 130 is also formed relatively low in the opening 130. Therefore, referring to FIG. 1, the portion of the gate dielectric layer 120 included in the circle 1 is close to the path 2 of the current in the channel. Moreover, the distance between the portion of the gate dielectric layer 120 that covers the sidewall surface of the opening 130 and the drain region 111 is also small. Therefore, when the drain region 111 receives a high voltage, the portion of the gate dielectric layer 120 that covers the sidewall surface of the opening 130 is in a high electric field, and thus the gate dielectric layer 120 may be easily broken down.

Figure 15:
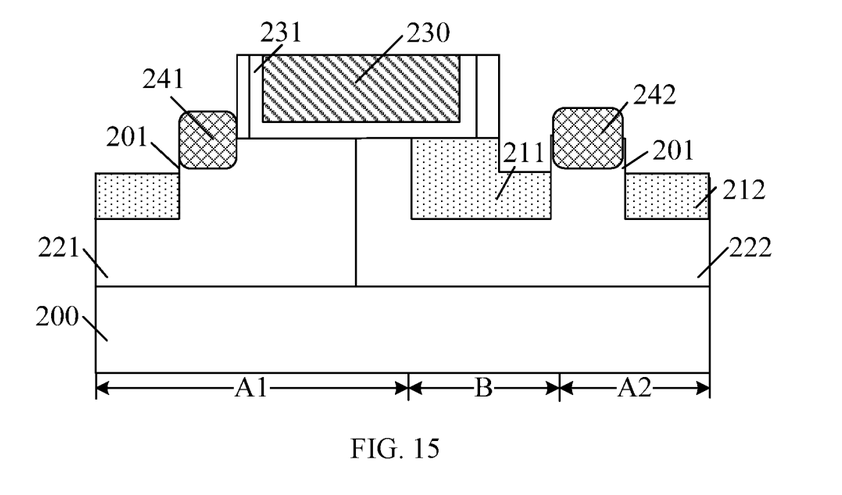
Figure 16:
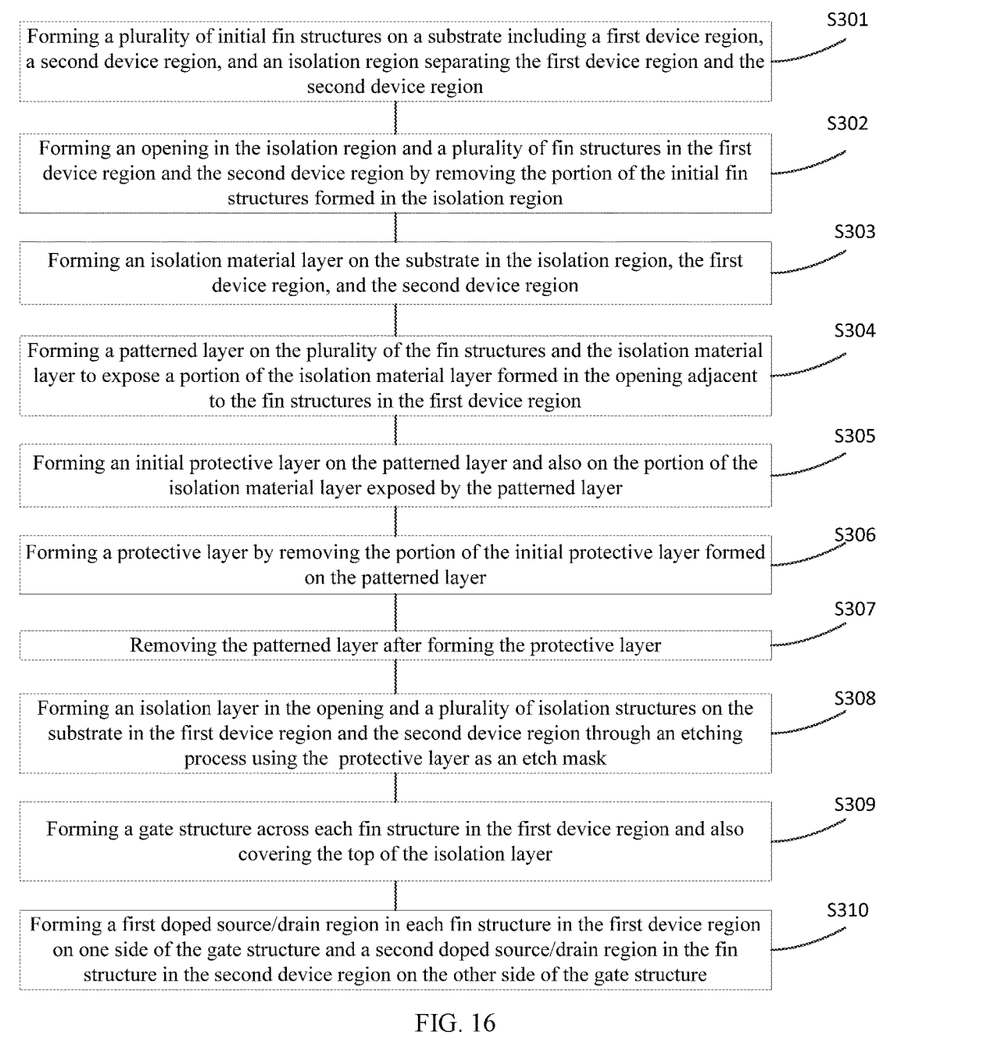
FIG. 16 illustrates a flowchart of an exemplary method for fabricating an LDMOS device consistent with various disclosed embodiments in the present disclosure.

An LDMOS device and a method for fabricating the LDMOS device are provided. FIG. 16 shows a flowchart of an exemplary method for fabricating an LDMOS device consistent with various disclosed embodiments in the present disclosure. FIGS. 2-15 show schematic cross-section views of semiconductor structures at certain stages of the exemplary method for fabricating the LDMOS device consistent.

Figure 2:
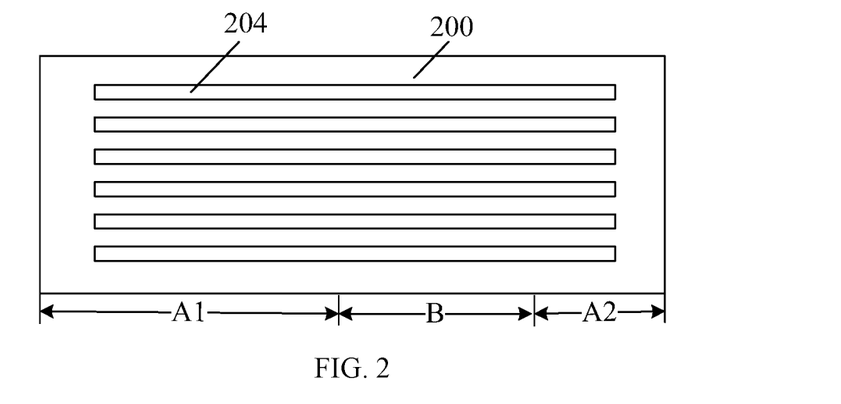
FIGS. 2-15 illustrate schematic cross-section views of semiconductor structures at certain stages of an exemplary method for fabricating an LDMOS device consistent with various disclosed embodiments in the present disclosure.

Referring to FIG. 16, at the beginning of the fabrication process, a plurality of initial fin structures may be formed on a substrate that includes a first device region and a second device region separated by an isolation region (S301). FIG. 2 shows a schematic top view of a corresponding semiconductor structure.

Referring to FIG. 2, a substrate 200 is provided. A plurality of initial fin structures 204 may be formed on the substrate 200. The initial fin structures 204 on the substrate 200 may include a first device region A1, a second device region A2, and an isolation region B. The isolation region B may separate the second device region A2 from the first device region A1.

In one embodiment, the first device region A1 may be used to form the gate structures and the source regions of the subsequently-formed LDMOS devices; the second device region A2 may be used to form the drain regions of the subsequently-formed LDMOS devices; the isolation region B may be used to increase the resistance between the first device region A1 and the second device region A2.

In one embodiment, the plurality of initial fin structures 204 may be formed on the substrate 200 through a process including the following steps. First, an initial substrate may be provided. Then, a patterning process may be performed to pattern the initial substrate such that the substrate 200 and the plurality of initial fin structures 204 on the substrate 200 may be simultaneously formed. In other embodiments, the substrate 200 and the plurality of initial fin structures 204 may also be formed by any other appropriate fabrication method.

In one embodiment, the initial substrate is made of silicon. In other embodiments, the initial substrate may also be made of germanium or SiGe.

In one embodiment, the plurality of initial fin structures 204 are made of silicon. In other embodiments, the plurality of initial fin structures 204 may also be made of germanium or SiGe.

In one embodiment, after providing the initial substrate and prior to patterning the initial substrate, the fabrication process may also include forming a first well in the initial substrate in the first device region A1 and forming a second well in the initial substrate in the first device region A1, the second device region A2, and the isolation region B. The first well and the second well may be in contact with each other.

The first well and the second well may have different types. The first well may contain first doping ions and the second well may contain second doping ions. For example, the first doping ions may be P-type ions such as boron ions; and the second doping ions may be N-type ions such as phosphor ions and arsenic ions.

In other embodiments, the first well and the second well may be formed in the substrate and the plurality of initial fin structures after the formation of the substrate and the initial fin structures.

Figure 3:
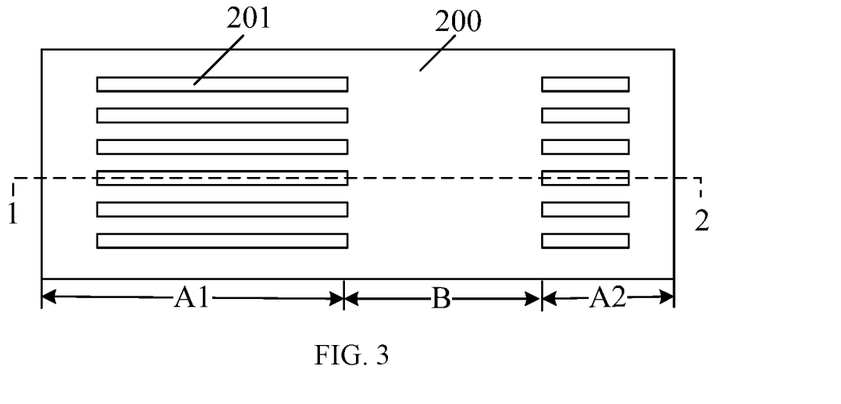
Figure 4:
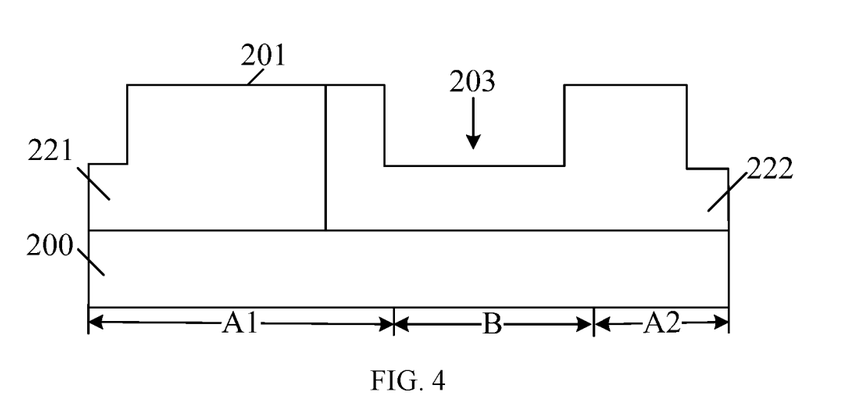

Further, returning to FIG. 16, an opening may be formed by removing the portion of the initial fin structures in the isolation region (S302). FIG. 3 shows a schematic top view of a corresponding semiconductor structure. FIG. 4 shows a schematic cross-section view of the semiconductor structure shown in FIG. 3 along a 1-2 line.

Referring to FIG. 3, the portion of the plurality of initial fin structures 204 (referring to FIG. 2) formed in the isolation region B may be removed to form an opening 203. Accordingly, the portion of the plurality initial fin structures 204 remaining on the substrate 200 in the first device region A1 and the second device region A2 may become a plurality of fin structures 201. In a subsequent process, an isolation layer may be formed in the opening 203.

In one embodiment, the portion of the initial fin structures 204 in the isolation region B may be removed by a process including the following steps. First, a mask layer may be formed on the substrate 200 as well as the portion of the initial fin structures 204 formed in the first device region A1 and the second device region A2. The mask layer may expose the portion of the initial fin structures 204 formed in the isolation region B. Further, an etching process using the mask layer as an etch mask may be performed on the initial fin structures 204 to remove the portion of the initial fin structures 204 formed in the isolation region B.

In one embodiment, the process to remove the portion of the initial fin structures 204 formed in the isolation region B may include dry etching or wet etching.

The plurality of fin structure 201 may be formed from the initial fin structures 204. Therefore, the fin structures 201 may be made of a same material as the initial fin structures 204. In one embodiment, the initial fin structures 204 and the fin structures 201 are both made of silicon. In other embodiments, the initial fin structures 204 and the fin structures 201 may also be made of germanium or SiGe.

In other embodiments, the opening and the plurality of fin structures may be formed by a process including the following steps. First, an initial substrate is provided. A patterned mask layer may then be formed on the initial substrate. The mask layer may expose the initial substrate in the isolation region, a portion of the initial substrate in the first device region and the second device region. Then, the initial substrate may be patterned using the mask layer as an etch mask. As such, the substrate may be formed, and simultaneously, the plurality fin structures may be formed in the first device region and the second device region and the opening may be formed in the substrate of the isolation region.

In one embodiment, a first well 221 may be formed in the substrate 200 in the first device region A1 and a second well 222 may be formed in the substrate 200 in the first device region A1, the second device region A2, and the isolation region B. The first well 221 and the second well 222 may be in contact with each other.

The first well 221 may contain first doping ions and the second well 222 may contain second doping ions. In one embodiment, the first doping ions may be P-type ions such as boron ions; the second doping ions may be N-type ions such as phosphor ions and arsenic ions.

Figure 5:
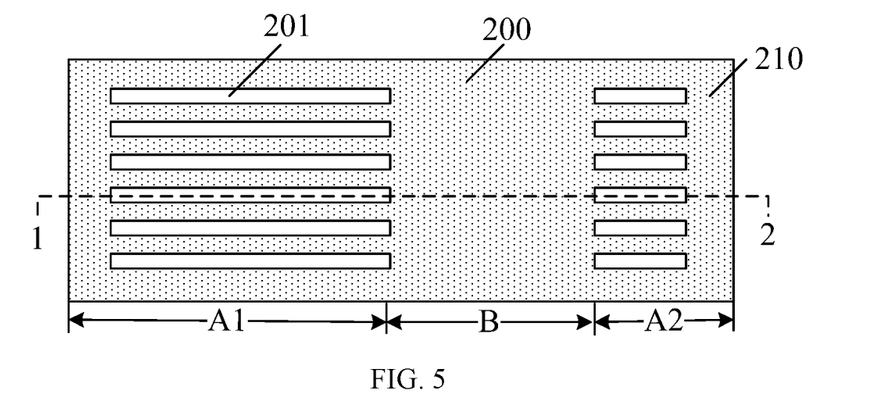
Figure 6:
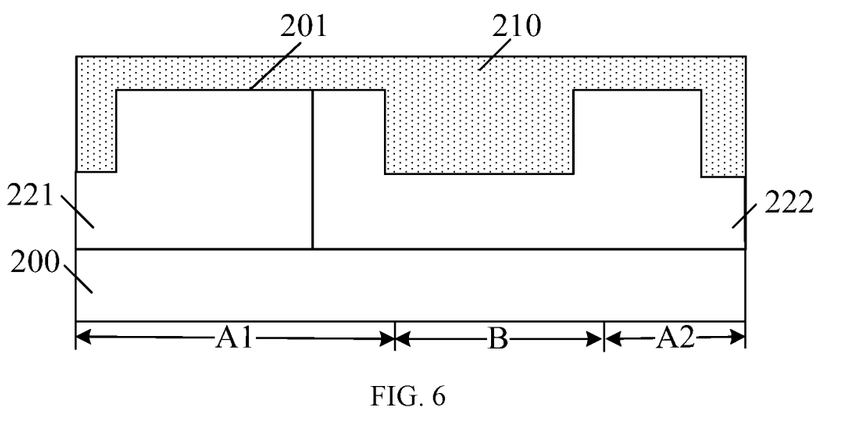

Returning to FIG. 16, further, an isolation material layer may be formed on the substrate of the isolation region, the first device region, and the second device region (S303). FIG. 5 shows a schematic top-view of a corresponding semiconductor structure. FIG. 6 shows a schematic cross-section view of the semiconductor structure shown in FIG. 5 along a 1-2 line.

Referring to FIGS. 5-6, an isolation material layer 210 formed on the substrate 200 in the first device region A1, the second device region A2, and the isolation region B. The top surface of the isolation material layer 210 may be higher than or leveled with the top surfaces of the plurality of fin structures 201. The isolation material layer 210 may be used to form an isolation layer and isolation structures in a subsequent process.

In one embodiment, the isolation material layer 210 may be made of $SiO_x$. In other embodiments, the isolation material layer may also be made of SiON or any other appropriate material.

In one embodiment, the isolation material layer 210 may be formed by a process including fluid chemical vapor deposition (CVD). Specifically, the isolation material layer 210 formed by a fluid CVD process may demonstrate desired gap-filling ability, and thus the isolation performance of the isolation layer and the isolation structures may be desired.

Figure 7:
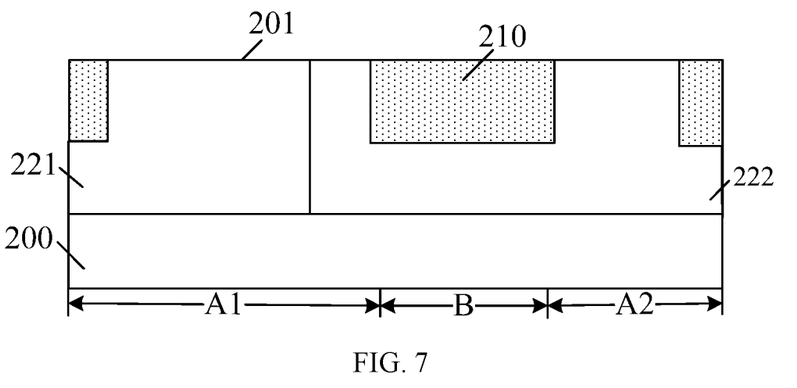

In one embodiment, the surface of the isolation material layer may be higher than the top surfaces of the plurality of fin structures 201. Accordingly, the process to form the isolation layer and the isolation structures may also include a planarization process performed on the isolation material layer 210. Referring to FIG. 7, the planarization process may be performed on the isolation material layer 210 until the top surface of the isolation material layer 210 is leveled with the top surfaces of the plurality of fin structures 201.

In one embodiment, performing the planarization process on the isolation material layer 210 may ensure the top surface of the subsequently-formed isolation layer leveled with the top surfaces of the plurality of fin structures 201, and thus may be conducive to the subsequent formation of the gate structures.

In other embodiments, the top surface of the subsequently-formed isolation layer may be higher than the top surfaces of the plurality of fin structures. Therefore, a planarization process performed on the isolation material layer may not be required for the formation of the isolation layer and the isolation structures.

In one embodiment, the isolation material layer 210 may be planarized by a chemical mechanical polishing (CMP) process.

Figure 8:
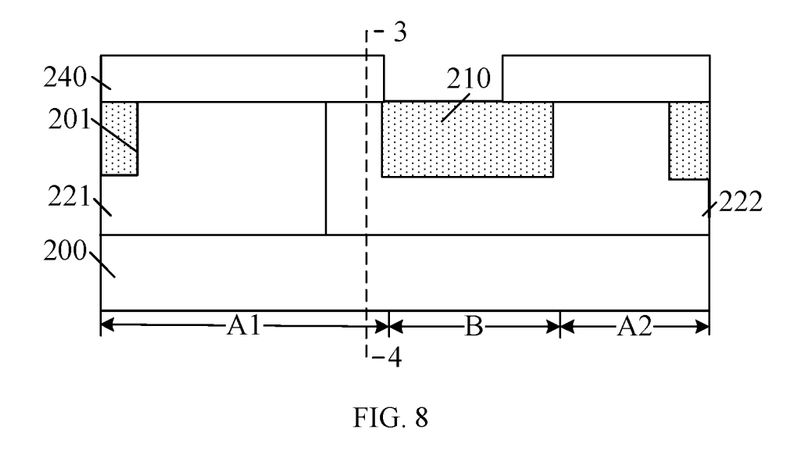
Figure 9:
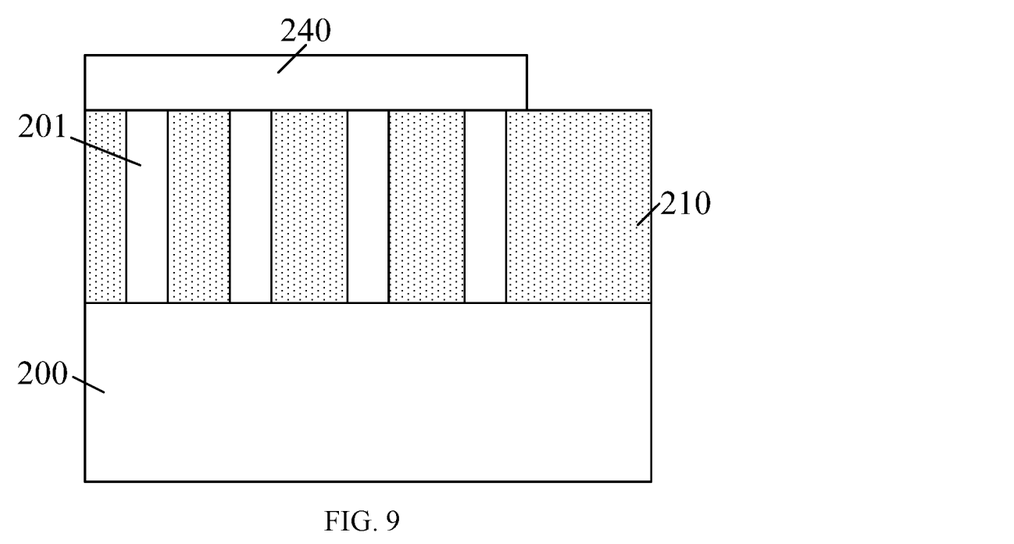

Further, returning to FIG. 16, a patterned layer exposing a portion of the isolation material layer in the opening adjacent to the fin structures in the first device region may be formed on the plurality of fin structures and the isolation material layer (S304). FIG. 8 shows a schematic cross-section view of a corresponding semiconductor structure. FIG. 9 shows a schematic cross-section view of the semiconductor structure shown in FIG. 8 along a 3-4 line.

Referring to FIGS. 8-9, a patterned layer 240 may be formed on the plurality of fin structures 201 and the isolation material layer 210. The patterned layer 240 may expose a portion of the isolation material layer 210 in the opening 203 adjacent to each fin structure 201 in the first device region A1.

In one embodiment, the patterned layer 240 may be made of $SiN_x$. In other embodiments, the patterned layer may also be made of SiON or any other appropriate material.

In one embodiment, the patterned layer 240 may cover the isolation material layer 210 formed between neighboring fin structures 201 in the first device region A1 and also between neighboring fin structures 201 in the second device region A2.

In one embodiment, the patterned layer 240 may be formed by a process including the following steps. First, an initial pattern layer may be formed on the plurality of fin structures 201 and the isolation material layer 210. The initial pattern layer may then be patterned to expose the portion of the isolation material layer 210 formed in the opening 203 (referring to FIG. 4) adjacent to each fin structure 201 in the first device region A1. As such, the patterned layer 240 may be formed.

Figure 10:
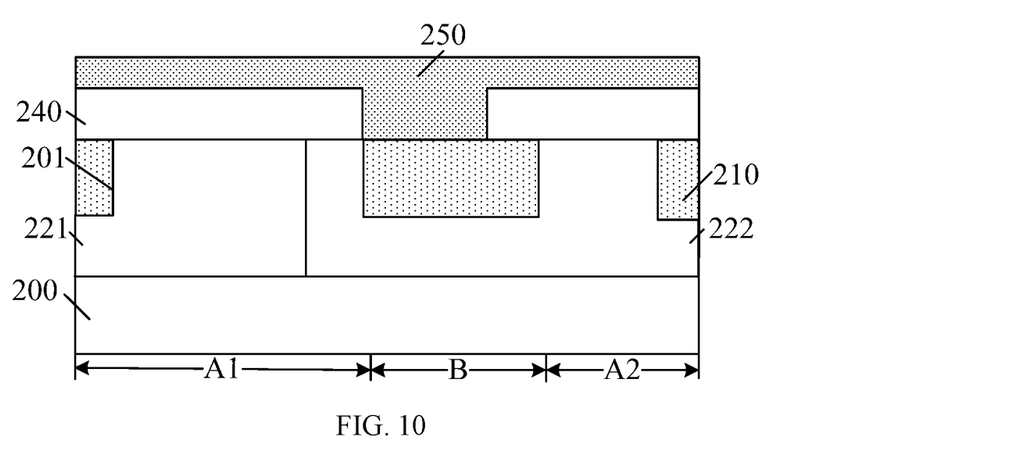

Further, returning to FIG. 16, an initial protective layer may be formed on the patterned layer and the portion of the isolation material layer exposed by the patterned layer (S305). FIG. 10 shows a schematic cross-section view of a corresponding semiconductor structure.

Referring to FIG. 10, an initial protective layer 250 may be formed on the patterned layer 240 and the portion of the isolation material layer 210 exposed by the patterned layer 240. In one embodiment, the initial protective layer 250 may be used to form a protective layer in a subsequent process.

The initial protective layer 250 may be made of a same material as the isolation material layer 210. Therefore, in a subsequent process, a single etching process may be performed to etch both the initial protective layer 250 and the isolation material layer 210 such that the fabrication process may be simplified. For example, the initial protective layer 250 and the isolation material layer 210 may both be made of $SiO_x$. In other embodiments, the material used to form the initial protective layer may be different from the material used to form the isolation material layer.

In one embodiment, the initial protective layer 250 may be formed by a CVD process.

Figure 11:
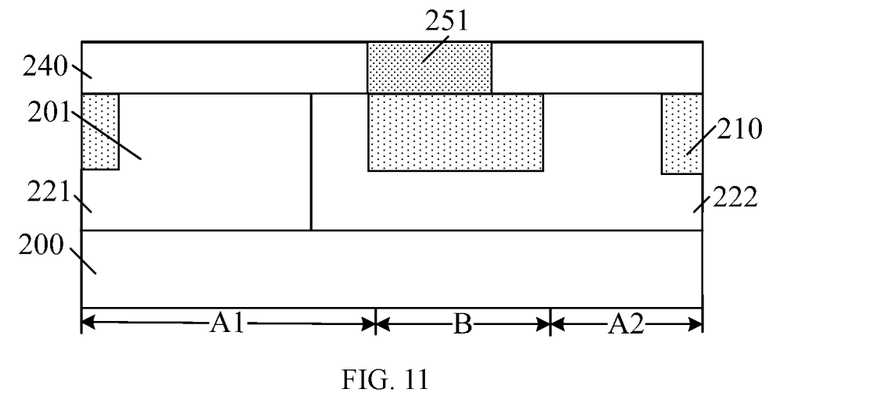

Further, returning to FIG. 16, the portion of the initial protective layer formed on the patterned layer may be removed to form a protective layer (S306). FIG. 11 shows a schematic cross-section view of a corresponding semiconductor structure.

Referring to FIG. 11, a protective layer 251 may be formed by removing the portion of the initial protective layer 250 (referring to FIG. 10) formed on the patterned layer 240. The protective layer 251 may be used to protect the portion of the isolation material layer 210 under the protective layer 251 from being etched during an etching process performed on the isolation material layer 210.

In one embodiment, the portion of the initial protective layer 250 formed on the patterned layer 240 may be removed by a CMP process.

Moreover, the thickness of the protective layer 251 may not be too large or too small. Specifically, when the thickness of the protective layer 251 is too small, the protective layer 251 may not be able to provide sufficient protection for the portion of the isolation material layer 210 formed under the protective layer 251; however, when the thickness of the protective layer 251 is too large, the process difficulty may be increased. Therefore, the thickness of the protective layer 251 may be in a range of approximately 300 Å to 700 Å.

Figure 12:
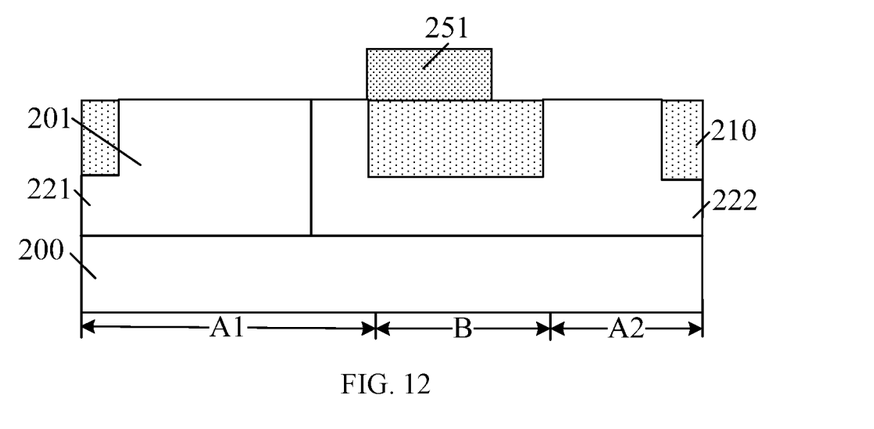

Further, returning to FIG. 16, the patterned layer may be removed after forming the protective layer (S307). FIG. 12 shows a schematic cross-section view of a corresponding semiconductor structure.

Referring to FIG. 12, after forming the protective layer 251, the patterned layer 240 may be removed. In one embodiment, the patterned layer 240 may be removed by a process including dry etching or wet etching.

Figure 13:
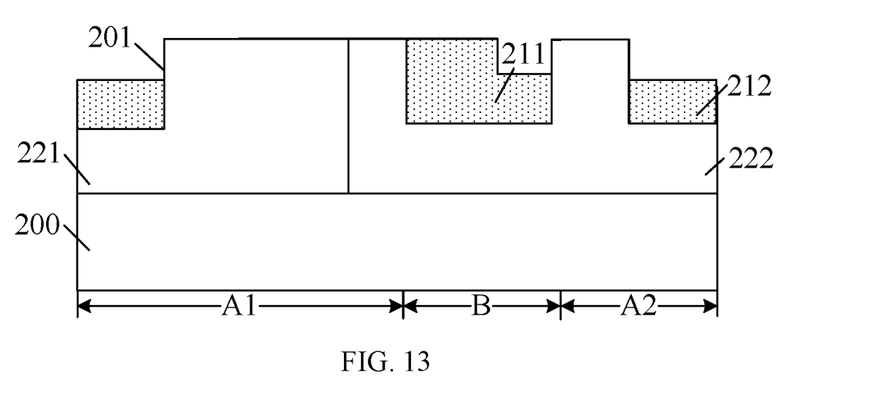

Further, returning to FIG. 16, an etching process may be performed on the isolation material layer using the protective layer as an etch mask to form an isolation layer in the opening and a plurality of isolation structures on the substrate in the first device region and the second device region (S308). FIG. 13 shows a schematic cross-section view of a corresponding semiconductor structure.

Referring to FIG. 13, an etching process may be performed on the isolation material layer 210 using the protective layer 251 as an etch mask. As the surface of the portion of the isolation material layer 210 in the first device region A1 and the second device region A2 becomes lower than the top surfaces of the plurality of fin structures 201, an isolation layer 211 may be formed in the opening 203 (referring to FIG. 4) and a plurality of isolation structures 212 may be formed on the substrate 200 in the first device region A1 and also in the second device region A2.

The isolation layer 211 may be used to electrically isolate the fin structures 201 in the first device region A1 from the fin structures 201 in the second device region A2 such that the length of the path of the current may be increased. As a result, the resistance between the subsequently-formed gate structure and the drain region may be increased so that the ability of the formed LDMOS device to sustain high voltage may be improved. Moreover, the isolation structures 212 may be used to electrically isolate neighboring fin structures 201.

In one embodiment, the isolation material layer 210 and the protective layer 251 (referring to FIG. 11) may be made of a same material. Therefore, during the process to etch the isolation material layer 210, the protective layer 151 may also be etched. In other embodiments, the material used to form the isolation material layer may be different from the material used to form the protective layer; accordingly, after forming the isolation layer and the isolation structures, the protective layer may be removed by a separate process.

In one embodiment, the isolation material layer 210 and the protective layer 251 may be removed by a dry etching process. In other embodiments, the isolation material layer and the protective layer may also be removed by a wet etching process.

In one embodiment, the process parameters adapted in the dry etching process to remove the isolation material layer 210 and the protective layer 251 may include an etch gas including He, $NH_3$, and $NF_3$, a flow rate of He in a range of approximately 100 sccm to 5000 sccm, a flow rate of $NH_3$ in a range of approximately 100 sccm to 900 sccm, a flow rate of $NF_3$ in a range of approximately 20 sccm to 600 sccm, a pressure in a range of approximately 2 Torr to 1000 Torr, and a reaction time in a range of approximately 20 s to 1000 s.

Figure 14:
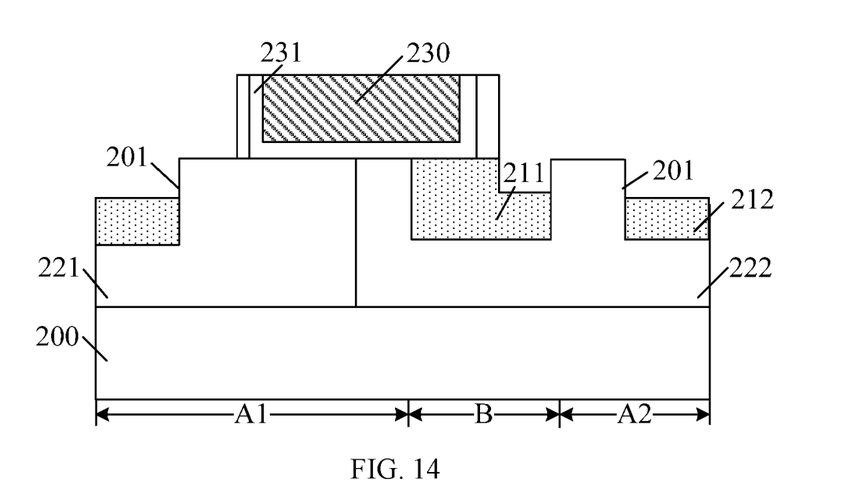

Further, returning to FIG. 16, a gate structure may be formed across each fin structure in the first device region and also on the top of the isolation layer (S309). FIG. 14 shows a schematic cross-section view of a corresponding semiconductor structure.

Referring to FIG. 14, a gate structure may be formed across each fin structure 201 in the first device region A1. The gate structure may be formed on a portion of the sidewall and the top surfaces of the fin structure 201 in the first device region A1 and may also cover the top surface of the isolation layer 211.

The gate structure may include a gate dielectric layer covering the top surface of the isolation layer 211, a portion of the sidewall and the top surfaces of the fin structure 201 in the first device region A1, and a gate electrode 230 formed on the gate dielectric layer 231.

The gate dielectric layer 231 and the gate electrode 230 may be both situated on the top of the fin structure 201 and also on the top of the isolation layer 210. The gate dielectric layer 231 may not cover the portion of the fin structure 201 previously severing as a sidewall of the opening 203 (referring to FIG. 4) in the first device region. As such, the gate dielectric layer 231 may be always in a relatively small electric field during the operation of the formed LDMOS device. Therefore, the gate dielectric layer 231 may not be easily broken down and the performance of the formed LDMOS device may be improved.

In one embodiment, the gate dielectric layer 231 may be made of a high-k (i.e. k>3.9) dielectric material, such as $HfO_2$, $La_2O_3$, HfSiON, $HfAlO_2$, $ZrO_2$, $Al_2O_3$, $HfSiO_4$, etc. In other embodiments, the gate dielectric laeyr may also be made of SiOx.

In one embodiment, the gate electrode 230 may be made of metal, such as Al, Cu, Ag, Au, Ni, Ti, W, WN, WSi, etc. In other embodiments, the gate electrode may also be made of polycrystalline silicon.

Further, returning to FIG. 16, a first doped source/drain region may be formed in each fin structure in the first device region on one side of the gate structure and a second doped source/drain region may be formed in the fin structure in the second device region on the other side of the gate structure (S310). FIG. 15 shows a schematic cross-section view of a corresponding semiconductor structure.

Referring to FIG. 15, a first doped source/drain region 241 may be formed in each fin structure 201 in the first device region A1 on one side of the gate structure while a second doped source/drain region 242 may be formed in the fin structure 201 in the second device region A2 on the other side of the gate structure.

In one embodiment, the first doped source/drain region 241 may be used as the source region of the LDMOS transistor and the second doped source/drain region 242 may be used as the drain region of the LDMOS transistor.

In one embodiment, the process to form the first doped source/drain region 241 and the second doped source/drain region 242 in each fin structure 201 may include the following steps. First, a first trench may be formed in the fin structure 201 in the first device region A1 on one side of the gate structure. A second trench may be formed in the fin structure 201 in the second device region A2 on the other side of the gate structure. The first doped source/drain region 241 may then be formed in the first trench. The second doped source/drain region 242 may be formed in the second trench.

In one embodiment, the first trench and the second trench may be formed by an etching process combining dry etching and wet etching and using the gate structure, the isolation layer 211, and the isolation structures 212 together as an etch mask.

In one embodiment, an epitaxial growth process may be adapted to form the first doped source/drain region 241 in the first trench and the second doped source/drain region 242 in the second trench. During the epitaxial growth process, the first doped source/drain region 241 and the second doped source/drain region 242 may also be doped using an in-situ doping method. As such, doping ions may be introduced into the first doped source/drain region 241 and the second doped source/drain region 242.

In one embodiment, the doping ions may be phosphor ions, arsenic ions, or any appropriate ions. In another embodiment, the doping ions may be boron ions or any appropriate ions.

According to the fabrication method described above, the portion of each fin structure exposed by the opening in the first device region may be covered by a subsequently-formed isolation layer. A gate structure is then formed on the top of the fin structure and the isolation layer. Therefore, the formed gate structure does not cover the portion of the fin structure previously serving as a sidewall of the opening in the first device region. As such, the distance between the gate structure and the substrate may be large. Moreover, during the operation of the formed LDMOS device, the path of the current may be in the portion of the substrate covered by the isolation layer. Therefore, the distance from the gate structure to the path of the current may be large such that the gate structure may be always in a relatively small electric field during the operation of the LDMOS device. As results, the gate dielectric layer in the gate structure may not be easily broken down and the performance of the formed LDMOS device may be improved.

Further, the present disclosure also provides an LDMOS device. FIG. 15 shows a schematic cross-section view of an exemplary LDMOS device consistent with various embodiments of the present disclosure.

Referring to FIG. 15, the LDMOS device may include a substrate 200 and a plurality of fin structures 201 formed on the substrate 200. Each fin structure 201 may include a first device region A1 and a second device region A2 separated by an isolation region B. The fin structure 201 in the isolation region B may include an opening, and an isolation layer 211 may be formed in the opening. The isolation layer 211 may cover the portion of the fin structures 201 exposed by the sidewall of the opening in the first device region A1. The isolation layer 211 may expose the top surfaces of the plurality of fin structures 201. Further, the LDMOS device may also include a gate structure formed across each fin structure 201 in the first device region A1. The gate structure may be formed on a portion of the sidewall and the top surfaces of the fin structure 201 in the first device region A1. In addition, the gate structure may also cover the top surface of the isolation layer 211.

In one embodiment, the first device region A1 may be used to form a gate structure and a source region corresponding to each fin structure of the LDMOS device, the second device region A2 may be used to form a drain region corresponding to each fin structure of the LDMOS device, and the isolation region may be used to increase the resistance between the first device region A1 and the second device region A2.

In one embodiment, the initial substrate is made of silicon. In other embodiments, the initial substrate may also be made of germanium or SiGe.

A first well 221 and a second well 222 may be formed in the substrate 200 and the fin structures 201. The first well 221 and the second well 222 may be in contact with each other.

In one embodiment, the first well 221 may be formed in the substrate 200 and fin structures 201 in the first device region A1; the second well 222 may be formed in the substrate 200 and the fin structures 201 in the first device region A1, in the substrate 200 of the isolation region B, and also in the substrate 200 and the fin structures 201 in the second device region A2.

The first well 221 may contain first doping ions and the second well 222 may contain second doping ions. The type of the first doping ions may be different from the type of the second doping ions. In one embodiment, the first doping ions may be P-type ions such as boron ions; the second doping ions may be N-type ions such as phosphor ions and arsenic ions.

The isolation layer 211 may be used to electrically isolate the fin structures 201 in the first device region A1 from the fin structures 201 in the second device region A2. Therefore, the length of the path of the current may be increased. As a result, the resistance between each subsequently-formed gate structure and the corresponding drain region may be increased so that the ability of the formed LDMOS device to sustain high voltage may be improved. Moreover, the isolation structures 212 may be used to electrically isolate neighboring fin structures 201.

In one embodiment, the isolation layer 211 may expose the portion of each fin structure 201 in the second device region A2 that serves as a sidewall of the opening 203. In other embodiments, the isolation layer may also cover the portion of each fin structure in the second device region that serves as a sidewall of the opening.

In one embodiment, the top surface of the isolation layer 211 may be leveled with the top surfaces of the plurality of fin structures 201. In other embodiments, the top surface of the isolation layer may be higher than the top surfaces of the fin structures. In one embodiment, the top surface of the isolation layer 211 may refer to the highest surface point of the isolation layer 211.

In one embodiment, the isolation structures 212 and the isolation layer 211 may be made of a same material. For example, the isolation structures 212 and the isolation layer 211 may be both made of $SiO_x$. In other embodiments, the isolation structures and the isolation layer may also be made of SiON.

Each gate structure may further include a gate dielectric layer 231 formed across the corresponding fin structure 201 in the first device region A1 and a gate electrode 230 formed on the gate dielectric layer 231. The gate dielectric layer 231 may be formed on a portion of the sidewall and the top surfaces of the fin structure 201 in the first device region and also covering the top of the isolation layer.

The gate dielectric layer 231 and the gate electrode 230 may be formed on the top surface of the fin structure 201 and also covering the top surface of the isolation layer 211. Therefore, the gate dielectric layer 231 may be always in a relatively small electric field during the operation of the formed LDMOS device. As such, the gate dielectric layer 231 may not be easily broken down and the performance of the formed LDMOS device may be improved.

In one embodiment, the gate dielectric layer 231 may be made of a high-k (i.e. k>3.9) dielectric material, such as HfO$_2$, La$_2$O$_3$, HfSiON, HfAlO$_2$, ZrO$_2$, Al$_2$O$_3$, HfSiO$_4$, etc. In other embodiments, the gate dielectric laeyr may also be made of SiO$_x$.

In one embodiment, the gate electrode 230 may be made of metal, such as Al, Cu, Ag, Au, Ni, Ti, W, WN, WSi, etc.

Further, the LDMOS device may also include a first doped source/drain region 241 formed in each fin structure 201 in the first device region A1 on the side of the corresponding gate structure away from the second device region A2, and a second doped source/drain region 242 formed in the fin structure 201 in the second device region A2.

In one embodiment, the doping ions may be phosphor ions or arsenic ions. In other embodiments, the doping ions may also be boron ions.

According to the LDMOS device described above, the portion of each fin structure exposed by the opening in the first device region may be covered by the isolation layer. The gate structure is situated on the top of the fin structure and the isolation layer. Therefore, the formed gate structure does not cover the portion of the fin structure previously serving as a sidewall of the opening in the first device region. As such, the distance between the gate structure and the substrate may be large. Moreover, during the operation of the LDMOS device, the path of the current is in the portion of the substrate covered by the isolation layer. Therefore, the distance from the gate structure to the path of the current may be large. Therefore, the gate structure may be always in a relatively small electric field during the operation of the LDMOS device. As such, the gate dielectric layer in the gate structure may not be easily broken down and the performance of the formed LDMOS device may be improved.

Compared to conventional fabrication methods and LDMOS devices, the disclosed fabrication methods and LDMOS devices may demonstrate several advantages.

For example, according to the disclosed LDMOS device, the portion of each fin structure exposed by the opening in the first device region may be covered by the isolation layer. The gate structure is situated on the top of each fin structure and the isolation layer. Therefore, the formed gate structure does not cover the portion of the fin structure previously serving as a sidewall of the opening in the first device region. As such, the distance between the gate structure and the substrate may be large. Moreover, during the operation of the LDMOS device, the path of the current is in the portion of the substrate covered by the isolation layer. Therefore, the distance from the gate structure to the path of the current may be large such that the gate structure may be always in a relatively small electric field during the operation of the LDMOS device. As such, the gate dielectric layer in the gate structure may not be easily broken down and the performance of the formed LDMOS device may be improved.

Further, according to the disclosed method for fabricating LDMOS devices, after forming the isolation layer in the opening, the isolation layer may cover the portion of each fin structure exposed by the opening in the first device region. Therefore, the subsequently-formed gate structure may not cover the portion of the fin structure on the sidewall of the opening in the first device region. Further, the gate structure may be always in a relatively small electric field during the operation of the LDMOS device. Therefore, the gate dielectric layer in the gate structure may not be easily broken down and the performance of the formed LDMOS device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A laterally diffused metal-oxide-semiconductor (LDMOS) device, comprising:
    a plurality of fin structures formed on a substrate, wherein the substrate includes a first device region, a second device region, and an isolation region sandwiched between the first and the second device regions, and an opening is formed in the fin structures in the isolation region;
    an isolation layer formed in the opening, wherein the isolation layer covers a sidewall of the opening formed by a portion of each fin structure in the first device region and a portion of a sidewall of the opening formed by a portion of each fin structure in the second device region, wherein a first top surface of the isolation layer is leveled with a top surface of the fin structures and a second top surface of the isolation layer is lower than the top surface of the fin structures; and
    a gate structure formed across each fin structure in the first device region, wherein the gate structure covers a portion of top surfaces of the fin structure in the first device region and a top surface of the isolation layer.

2. The LDMOS device according to claim 1, wherein:
    the isolation layer exposes a portion of a sidewall of the opening formed by a portion of each fin structure in the second device region; and
    the isolation layer covers an entire sidewall of the opening formed by a portion of each fin structure in the first device region.

3. The LDMOS device according to claim 1 further including:
    a plurality of isolation structures formed on the substrate in the first device region and the second device region.

4. The LDMOS device according to claim 1 further including:
    a first well formed in the fin structures and the substrate in the first device region;
    a second well formed in the fin structures and the substrate in the first device region, the substrate of the isolation region, and also the fin structures and the substrate in the second device region; and
    the first well and the second well are in contact with each other.

5. The LDMOS device according to claim 4, wherein:
    the first well is doped with first doping ions;
    the second well is doped with second doping ions; and
    a type of the first doping ions is opposite to a type of the second doped ions.

6. The LDMOS device according to claim 1 further including:
  a first doped source/drain region formed in each fin structure in the first device region; and
  a second doped source/drain region formed in each fin structure in the second device region, wherein:
    the first doped source/drain region and the second doped source/drain region are situated on two opposite sides of the gate structure.

7. The LDMOS device according to claim 1, wherein the isolation layer is made of a material including SiOx and SiON.

8. The LDMOS device according to claim 1, wherein each gate structure includes:
  a gate dielectric layer formed across the fin structure in the first device region and covering the portion of the sidewall and the top surfaces of the fin structure and the first top surface of the isolation layer; and
  a gate electrode formed on the gate dielectric layer.

9. A method for fabricating an LDMOS device, comprising:
  forming a plurality of fin structures on a substrate, wherein the substrate includes a first device region, a second device region, and an isolation region sandwiched between the first and the second device regions, and an opening is formed in the fin structures in the isolation region;
  forming an isolation layer in the opening to cover a sidewall of the opening formed by a portion of each fin structure in the first device region and a portion of a sidewall of the opening formed by a portion of each fin structure in the second device region, wherein a first top surface of the isolation layer is leveled with a top surface of the fin structures and a second top surface of the isolation layer is lower than the top surface of the fin structures; and
  forming a gate structure across each fin structure in the first device region, wherein the gate structure covers a portion of top surfaces of the fin structure in the first device region and the first top surface of the isolation layer.

10. The method for fabricating the LDMOS device according to claim 9, prior to forming the gate structure, further including:
  forming a plurality of isolation structures on the substrate in the first device region and the second device region with the second top surfaces of the isolation structures lower than the top surfaces of the fin structures.

11. A method for fabricating an LDMOS device, comprising:
  forming a plurality of fin structures on a substrate, wherein the substrate includes a first device region, a second device region, and an isolation region sandwiched between the first and the second device regions, and an opening is formed in the fin structures in the isolation region;
  forming an isolation layer in the opening to cover a sidewall of the opening formed by a portion of each fin structure in the first device region;
  forming a plurality of isolation structures on the substrate in the first device region and the second device region with top surfaces of the isolation structures lower than the top surfaces of the fin structures; and
  forming a gate structure across each fin structure in the first device region, wherein the gate structure covers a portion of the top surfaces of the fin structure in the first device region and a top surface of the isolation layer, wherein the isolation layer and the plurality of isolation structures are formed by a process including:
    forming an isolation material layer on the substrate in the isolation region, the first device region, and the second device region with a top surface of the isolation material layer higher than or leveled with the top surfaces of the fin structures;
    forming a protective layer on a portion of the isolation material layer formed in the opening adjacent to each fin structure in the first device region; and
    forming the isolation layer and the plurality of isolation structures by etching the isolation material layer using the protective layer as an etch mask until top surfaces of the isolation material layer in the first device region and the second device region become lower than the top surfaces of the fin structures.

12. The method for fabricating the LDMOS device according to claim 11, wherein forming the protective layer further includes:
  forming a patterned layer on the fin structures and the isolation material layer, wherein the patterned layer exposes the portion of the isolation material layer formed in the opening adjacent to each fin structure in the first device region;
  forming an initial protective layer on the patterned layer and the portion of the isolation material layer exposed by the patterned layer;
  forming the protective layer by removing a portion of the initial protective layer formed on the patterned layer; and
  removing the patterned layer after forming the protective layer.

13. The method for fabricating the LDMOS device according to claim 12, wherein:
  the portion of the initial protective layer formed on the patterned layer is removed by a process including chemical mechanical polishing.

14. The method for fabricating the LDMOS device according to claim 12, wherein the top surface of the isolation material layer is higher than the top surfaces of the fin structures, accordingly, prior to forming the initial protective layer, forming the isolation layer and the plurality of isolation structures further includes:
  performing a planarization process on the isolation material layer until the top surface of the isolation material layer leveled with the top surfaces of the fin structures.

15. The method for fabricating the LDMOS device according to claim 11, wherein the protective layer and the isolation material layer are made of a same material.

16. The method for fabricating the LDMOS device according to claim 11, wherein the isolation material layer is formed by a process including fluid chemical vapor deposition.

17. The method for fabricating the LDMOS device according to claim 9, after forming the plurality of isolation structures, further including:
  forming a first doped source/drain region in each fin structure in the first device region;
  forming a second doped source/drain region in each fin structure in the second device region; and
  the first doped source/drain region and the second doped source/drain region are formed on two opposite sides of the gate structure.

18. The method for fabricating the LDMOS device according to claim 9, prior to forming the isolation layer, further including:

forming a first well in the fin structures and the substrate in the first device region;

forming a second well in the fin structures and the substrate in the first device region, the substrate in the isolation region, and also the fin structures and the substrate in the second device region; and the first well and the second well are in contact with each other.

19. The method for fabricating the LDMOS device according to claim 10, wherein the isolation material layer is etched by a dry etching process using process parameters including:

an etch gas including He, $NH_3$, and $NF_3$;

a flow rate of He in a range of approximately 100 sccm to 5000 sccm;

a flow rate of $NH_3$ in a range of approximately 100 sccm to 900 sccm;

a flow rate of $NF_3$ in a range of approximately 20 sccm to 600 sccm;

a pressure in a range of approximately 2 Torr to 1000 Torr; and a reaction time in a range of approximately 20 s to 1000 s.

* * * * *